United States Patent
Corbin, Jr. et al.

(10) Patent No.: US 6,708,298 B2
(45) Date of Patent: Mar. 16, 2004

(54) METHOD FOR GUARANTEEING A MINIMUM DATA STROBE VALID WINDOW AND A MINIMUM DATA VALID WINDOW FOR DDR MEMORY DEVICES

(75) Inventors: William E. Corbin, Jr., Underhill, VT (US); David P. Monty, Essex Junction, VT (US); Erik A. Nelson, Waterbury, VT (US); Alan D. Norris, Hinesburg, VT (US); Steven W. Tomashot, Williston, VT (US); David E. Chapman, Shelburne, VT (US); Timothy E. Fiscus, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 430 days.

(21) Appl. No.: 09/768,122

(22) Filed: Jan. 23, 2001

(65) Prior Publication Data

US 2002/0099987 A1 Jul. 25, 2002

(51) Int. Cl.⁷ ................................................ G11C 29/00
(52) U.S. Cl. ........................................ 714/702; 714/718
(58) Field of Search .............................. 714/718, 702, 714/746, 700, 703, 763; 365/233, 230, 201, 78, 80; 327/141; 713/400; 324/211, 212, 76.61

(56) References Cited

U.S. PATENT DOCUMENTS

| | | | |
|---|---|---|---|
| 5,535,223 A | 7/1996 | Horstmann et al. | 371/27 |
| 5,633,879 A | 5/1997 | Potts et al. | 371/27 |
| 5,732,047 A | 3/1998 | Niijima | 368/10 |
| 5,768,159 A | 6/1998 | Belkadi et al. | 364/578 |
| 5,812,561 A | 9/1998 | Giles et al. | 371/22.31 |
| 6,034,916 A * | 3/2000 | Lee | 365/233 |
| 6,078,546 A * | 6/2000 | Lee | 365/233 |
| 6,101,612 A * | 8/2000 | Jeddeloh | 713/401 |
| 6,108,795 A * | 8/2000 | Jeddeloh | 713/401 |
| 6,215,726 B1 * | 4/2001 | Kubo | 365/233 |
| 6,314,536 B1 * | 11/2001 | Kurosaki | 714/718 |
| 6,317,372 B1 * | 11/2001 | Hayashi et al. | 365/201 |
| 6,389,525 B1 * | 5/2002 | Reichert et al. | 711/217 |
| 6,467,043 B1 * | 10/2002 | LaBerge | 713/401 |
| 6,489,819 B1 * | 12/2002 | Kono et al. | 327/141 |

* cited by examiner

*Primary Examiner*—Albert Decady
*Assistant Examiner*—Mujtaba Chaudry
(74) *Attorney, Agent, or Firm*—Schmeiser, Olsen & Watts; Robert A. Walsh (57) ABSTRACT

A method for testing the data strobe window (DQS) and data valid window (tDV) of a memory device (e.g., a DDR-type memory device) using the window strobe of a testing system.

19 Claims, 7 Drawing Sheets

METHOD FOR GUARANTEEING A MINIMUM DATA STROBE VALID WINDOW AND A MINIMUM DATA VALID WINDOW FOR DDR MEMORY DEVICES

TECHNICAL FIELD

The present invention relates generally to integrated circuits. In particular, the present invention relates to a method for testing memory devices such as Double Data Rate (DDR) memory devices.

BACKGROUND OF THE INVENTION

Figure 1:
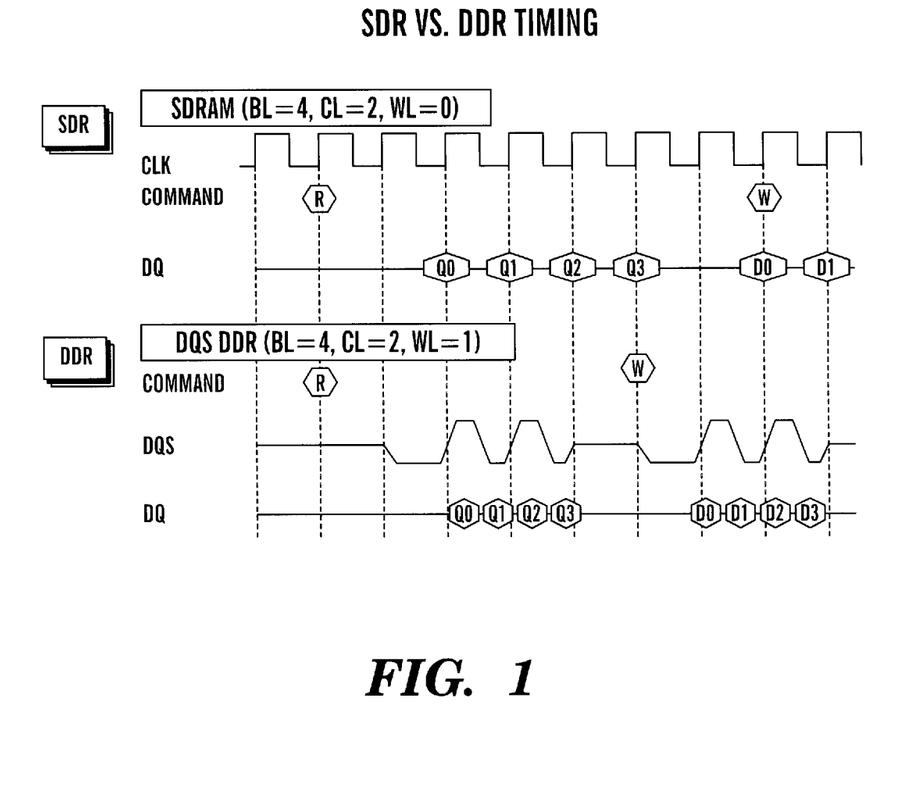
FIG. 1 is a timing diagram illustrating the general timing differences between SDR and DDR-type memory devices.

In synchronous semiconductor memory devices of the single-data rate (SDR) type, data is latched at the rising edge of the clock (CLK) signal. In synchronous semiconductor memory devices of DDR type, however, a timing circuit is provided that not only latches data at the rising edge of the clock (CLK) signal, but also at the trailing edge thereof, i.e., the middle of the cycle of the clock (CLK) signal. Accordingly, in a DDR-type memory device, twice as much data can be transferred within a unit time as compared to an SDR-type memory device. A timing diagram illustrating the general timing differences between SDR and DDR-type memory devices is provided in FIG. 1. As illustrated in FIG. 1, for DDR-type memory devices, output data is provided on the data Input/Output, or "DQ" lines, in response to a Data Strobe (DQS) pulse or window.

The width tDSQ of the data strobe (DQS) valid window and the width tDV of the data valid window are critical factors in the implementation of DDR memory systems. These factors must be characterized in development and guaranteed during manufacturing testing. Unfortunately, known techniques for establishing the widths of the data strobe valid window and the data valid window result in poor yield or tighter specifications than necessary, since these parameters cannot be tested directly using currently available methods. For example, current industry standards limit the minimum width of the data valid window tDV to 0.35*tCK (clock duty cycle). This corresponds to 2.625 nS for PC266 DDR memory (tCK=7.5 ns). Current industry standards also limit tDQSCK$_{max/min}$ (data strobe (DQS) to data (DQ) skew) to 500 pS for PC266 DDR memory.

A need exists, therefore, for a method for more accurately determining the widest possible minimum data strobe valid window and data valid window that can be guaranteed on a cycle to cycle basis.

SUMMARY OF THE INVENTION

The present invention provides a method for determining a wider data strobe (DQS) valid window that is guaranteed on a cycle to cycle basis. In addition, the present invention provides a method for determining a wider data valid window (tDV) that is also guaranteed on a cycle to cycle basis.

Generally, the present invention provides a method, comprising:
 providing a memory device;
 providing a testing system having a window strobe; and
 using the window strobe of the testing system to determine a width of a signal window of the memory device.

The present invention also provides a method for testing a data strobe window (DQS) of a memory device, comprising:

providing a testing system having a window strobe; and
determining a valid width of DQS using the window strobe.

The present invention further provides a method for testing a data valid window (tDV) of a memory device, comprising:

providing a testing system having a window strobe; and
determining a valid width of tDV using the window strobe.

The foregoing and other features of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Data Strobe (DQS) Window

The current technique for measuring the width of the data strobe (DQS) window is performed indirectly by searching for the leading edge of the data strobe with respect to a rising input clock edge and subsequently searching for the trailing edge of the data strobe with respect to a falling input clock edge. This method requires finding both ends of the data strobe window.

Figure 2:
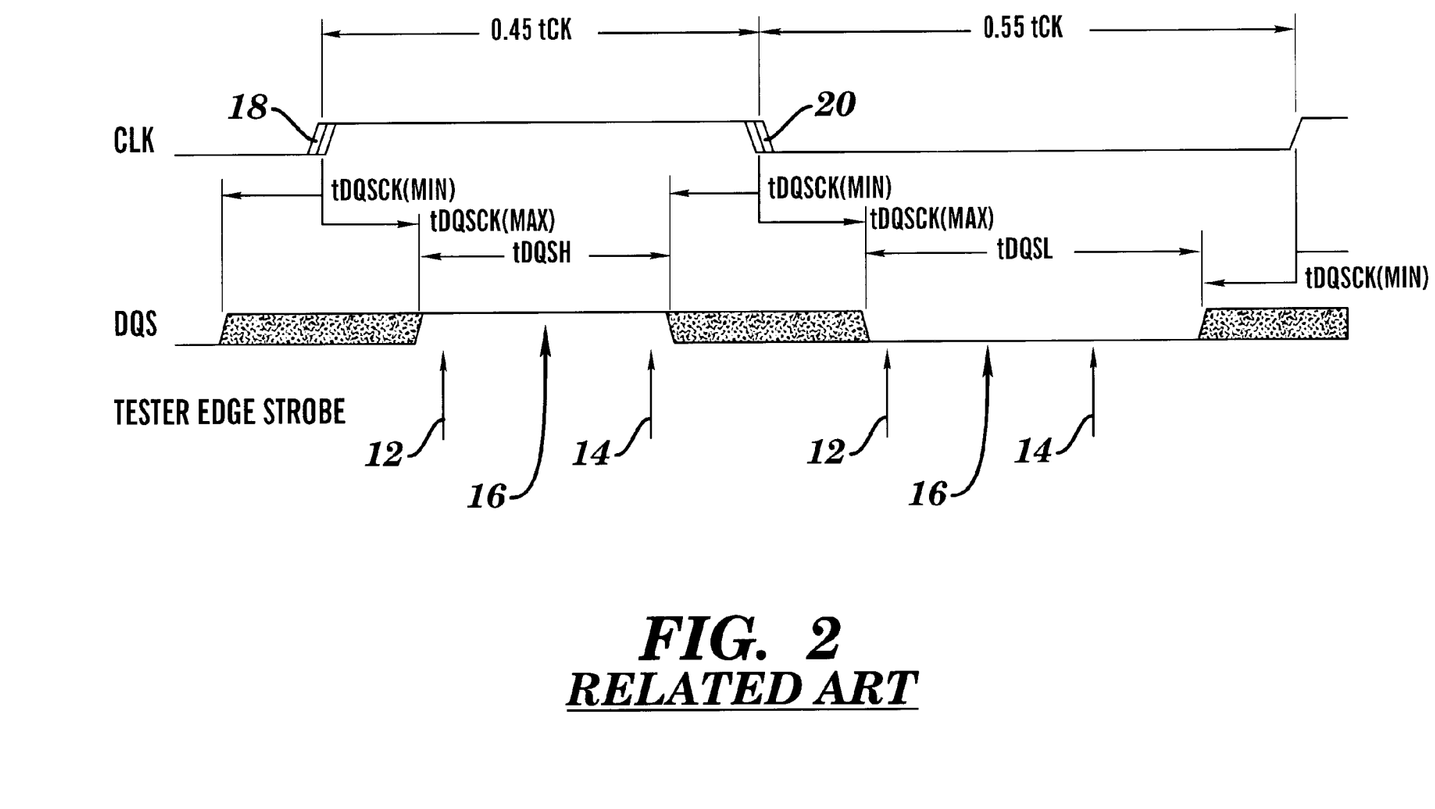
FIG. 2 is a timing diagram illustrating a method for determining the width of a data strobe window in accordance with the related art.

As illustrated in the timing diagram of FIG. 2, this is accomplished by using the "tester edge strobes" 12, 14, commonly provided by available testing systems, such as the Teradyne 996 and Advantest 5581, and searching for the leading edge and trailing edge of DQS with respect to the clock signal (CLK) provided to a DDR-type memory device over many memory read cycles. In the timing diagram of FIG. 2, as well as the timing diagrams described infra with regard to FIGS. 3 and 6, CLK has a worst case 45/55 duty cycle tCK. In the timing diagrams described infra with regard to FIGS. 4 and 7, CLK has a worst case 55/45 duty cycle tCK. Many other duty cycles tCK that are not worst case, such as 50/50, 49/51, etc., are also possible.

The first part of this measurement involves setting the tester's edge strobe 12 within the DQS valid window 16 and then moving (or shmooing) the edge strobe 12 backward (negative in time) until the DQS signal is found to be invalid. This procedure incrementally searches for the latest DQS transition with respect to the rising edge 18 of the input clock (CLK) of the DDR-type memory device. This is determined to be the beginning of the data strobe valid window. This procedure is performed under worst case operating conditions (voltage, temperature) while reading a worst case output data pattern on the DQ's that insures that the worst case data strobe to clock skew has been identified (tDQSCK$_{max}$). Such a worst case output data pattern may comprise, for example, a pattern wherein all of the DQ's are switching simultaneously from low to high and the data strobe (DQS) is switching from low to high. Under these conditions, since the data strobe (DQS) and the DQ's share the same power grid bus, the data strobe (DQS) and the DQ's will rise (and fall) later in time with respect to the clock (CLK) input than would otherwise occur if all DQ's did not change state.

The second part of this measurement involves setting the tester's edge strobe 14 within the same DQS valid window 16 and then shmooing the edge strobe 14 forward (positive in time) until the DQS signal is found to be invalid. This procedure incrementally searches for the earliest DQS transition with respect to the falling edge 20 of the input clock (CLK) of the DDR-type memory device. This is determined to be the end of the data strobe valid window. This procedure is again performed under worst case operating conditions (voltage, temperature) while reading a worst case output data pattern on the DQ's to insure that the worst case data strobe to clock skew has been identified (tDQSCK$_{min}$). The worst case output data pattern may be the same as described above.

Once tDQSCK$_{max}$ and tDQSCK$_{min}$ are determined, the width of the data strobe (DQS) window is calculated by subtracting tDQSCK$_{max}$ and tDQSCK$_{min}$ from the minimum clock high time (tCKH$_{min}$) or minimum clock low time (tCKL$_{min}$) as set forth in EQUS. 1 and 2, respectively. In the present invention, tCKH$_{min}$ refers to the shortest time the CLK signal actually remains, or is expected to remain, high during any cycle, and tCKL$_{min}$ refers to the minimum time the CLK signal actually remains, or is expected to remain, low during any cycle. The values for tCKH$_{min}$ and tCKL$_{min}$ may be actual measured values, may be determined or estimated from the specification of the system that generates the CLK signal, or may be determined in any other suitable manner.

$$tDQSH_{min} = tCKH_{min} - tDQSCK_{max} - tDQSCK_{min} \quad \text{(EQU. 1)}$$

$$tDQSL_{min} = tCKL_{min} - tDQSCK_{max} - tDQSCK_{min} \quad \text{(EQU. 2)}$$

The width of the data strobe (DQS) window calculated in accordance with either EQU. 1 or EQU. 2 is much worse (i.e., smaller) than the actual width of the data strobe (DQS) that will ever occur for any given half clock cycle for a particular voltage, temperature, and output data pattern. Although the width of the data strobe (DQS) window will vary over time with respect to the input clock (CLK) signal because of temperature/voltage changes, clock phase changes, dynamic delay lock loop (DLL) changes, etc., these cumulative factors will never occur simultaneously for any given half clock cycle. This is one reason why measuring the width of the data strobe (DQS) window indirectly (i.e., based on CLK) will result in poor yield or tighter specifications than necessary.

The present invention provides a method for providing the guaranteed widest possible data strobe (DQS) window (tDQSH$_{min}$ or tDQSL$_{min}$). Unlike the edge strobe method described supra with regard to FIG. 2, the method of the present invention utilizes the "window strobe" 30 of a testing system 32 to establish tDQSH$_{min}$ or tDQSL$_{min}$. Examples of suitable testing systems 32 that provide a window strobe 30 having an adjustable (e.g., programmable) width include the Teradyne 996 and Advantest 5581.

Figure 3:
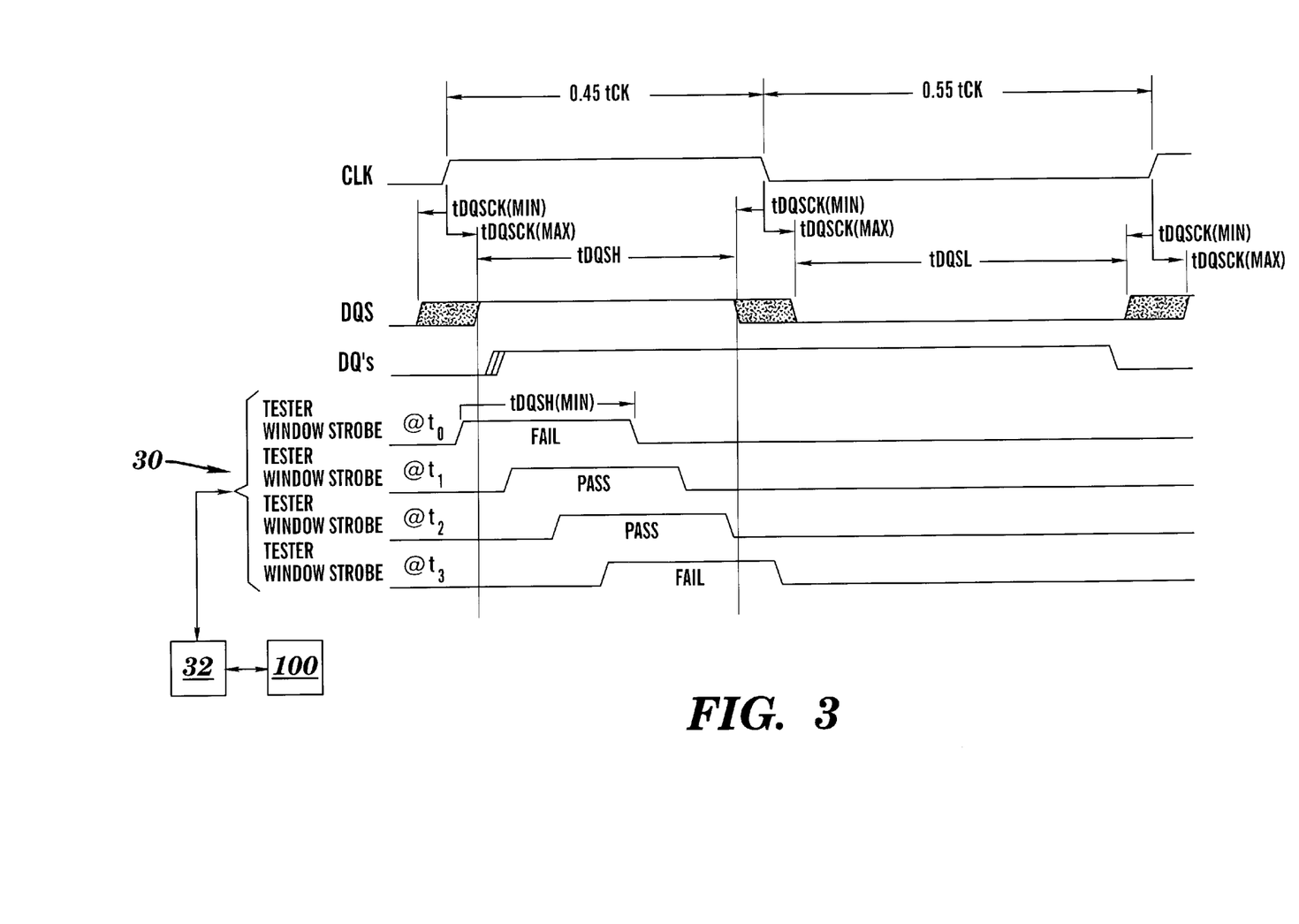
FIG. 3 is a timing diagram illustrating a method for determining the width of a data strobe (DQS) window in accordance with the present invention.

A timing diagram illustrating a method for determining tDQSH$_{min}$ for a worst case 45/55 CLK duty cycle for a DDR-type memory device 100 in accordance with the present invention is shown in FIG. 3. In particular, a window strobe 30 generated by a testing system 32 is programmed to a desired, initial time width corresponding to the DQS specification of the memory device 100. In practice, however, the actual setting programmed into the testing system 32 would be slightly less than the specification value to compensate for the resolution accuracy of the testing system 32. The output data pattern under test on the DQ's is sampled during the window strobe 30 and if the output data pattern is found to be valid at least once (i.e., the correct high or low state that was initially written into the memory device) during the entire window strobe 30, then the output data pattern under test is deemed as passing. If the output data pattern under test is only valid for a portion of the window strobe 30, then the signal under test is deemed as failing. A comparator, processor, or other device/system capable of comparing the voltage/state of the output data pattern under test on the DQ's to the expected values (e.g., stored in memory) may be used to determine the validity of the output data pattern.

To determine the DQS valid window, the width of the window strobe 30 is chosen to be equal to the width of the data strobe window (DQS) that is to be guaranteed (i.e., tDQSH$_{min}$ or tDQSL$_{min}$). In FIG. 3, for example, the window strobe 30 is incremented (shmooed) in a plurality of time increments through the minimum clock (CLK) high period (e.g., 0.45 tCK) while reading a worst case output data pattern on the DQ's from memory that results in the smallest possible data strobe (DQS) window width. Such a worst case output data pattern may again comprise, for example, a pattern wherein all of the DQ's are switching simultaneously from low to high and the data strobe (DQS) is switching from low to high. If the output data pattern on the DQ's is found to be valid during the entire window strobe 30 at least once as the window strobe 30 is shmooed through the clock high period (e.g., "window strobe@t$_1$" or "window strobe@t$_2$" in FIG. 3), then the data strobe (DQS) width (i.e., tDQSH$_{min}$) is guaranteed directly for that portion of the clock cycle. If the output data pattern under test is never found to be valid during the entire window strobe 30, then the current width of the window strobe 30 is too large and must be reduced. The above process is repeated as necessary, using smaller widths of the window strobe 30, until the width of the window strobe 30 results in a passing test, thereby providing a value of tDQSH$_{min}$ that can be guaranteed.

Figure 4:
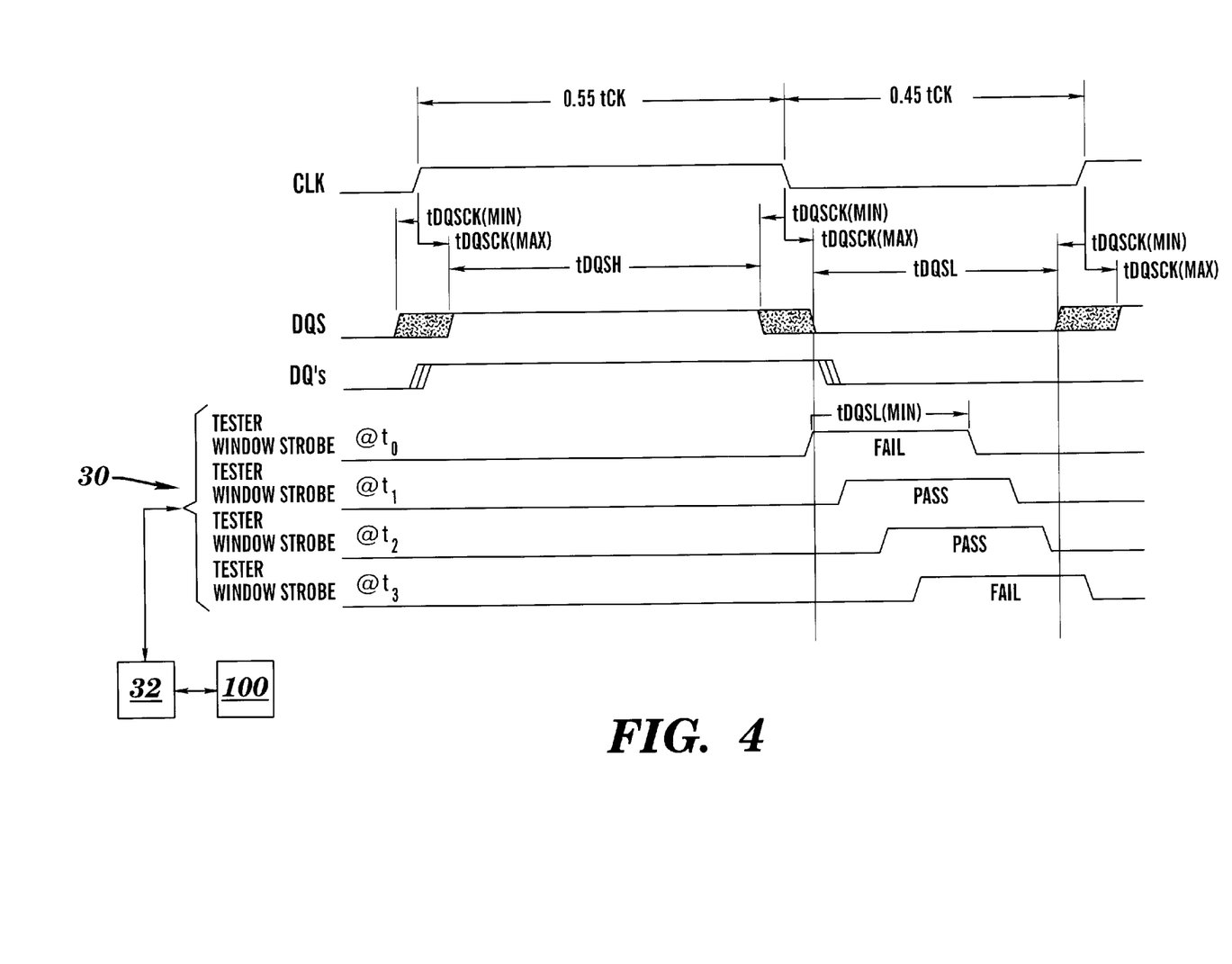
FIG. 4 is a timing diagram illustrating a method for determining the width of a data strobe (DQS) window in accordance with the present invention.

A timing diagram illustrating a method for determining tDQSL$_{min}$ for a worst case 55/45 CLK duty cycle for a DDR-type memory device 100 in accordance with the present invention is illustrated in FIG. 4. $tDQSL_{min}$ is determined in an analogous manner as $tDQSH_{min}$. In particular, the window strobe 30 is incremented (shmooed) in a plurality of time increments through the minimum clock (CLK) low period (e.g., 0.45 tCK) while reading a worst case output data pattern on the DQ's from memory that results in the smallest possible data strobe (DQS) window width. In this case, the worst case output data pattern is just the opposite of that used to determine $DQSH_{min}$. Such a worst case output data pattern may comprise, for example, a pattern wherein all of the DQ's are switching simultaneously from high to low and the data strobe (DQS) is switching from high to low. If the output data pattern on the DQ's remains valid during the entire window strobe 30 at least once as the window strobe 30 is shmooed through the clock low period (e.g., "window strobe@$t_1$" or "window strobe@$t_2$" in FIG. 4), then the data strobe (DQS) width (i.e., $tDQSL_{min}$) is guaranteed directly for that portion of the clock cycle. If the output data pattern under test is never found to be valid during the entire window strobe 30, then the current width of the window strobe 30 is too large and must be reduced. The above process is repeated as necessary, using smaller widths of the window strobe 30, until the width of the window strobe 30 results in a passing test, thereby providing a value of $tDQSL_{min}$ that can be guaranteed.

If the initial, desired value of $tDQSH_{min}$ (or $tDQSL_{min}$) results in a passing test, the width of the window strobe 30 in each case can be increased incrementally and the test can be repeated until failure. This process will result in the widest possible minimum data strobe valid window.

To insure that the data strobe (DQS) width is truly the worst case, the data pattern output from the memory device 100 during the measurement should be chosen to cause the slowest rising DQS edge and the fastest falling DQS edge (and vise versa). Once a worst case output data pattern, voltage and temperature are defined, then the minimum data strobe width (i.e., $tDQSH_{min}$ or $tDQSL_{min}$) can be guaranteed directly using the above described window strobe method which yields a larger valid window than can be achieved through indirect measurements.

This invention allows the data strobe (DQS) width to be guaranteed on a cycle by cycle basis. In doing so, the incremental detractors (temperature changes, clock phase changes, voltage changes, dynamic DLL changes, etc.) that creep into the data strobe (DQS) window measurement using the edge strobe method over many cycles of operation are eliminated.

Data Valid Window (tDV)

The current technique for measuring the width (tDV) of the data (DQ) valid window is performed indirectly by searching for the leading edge of the data with respect to a rising input clock edge and subsequently searching for the trailing edge of the data with respect to a falling input clock edge. This method requires finding both ends of the data valid window in order to establish tDV.

Figure 5:
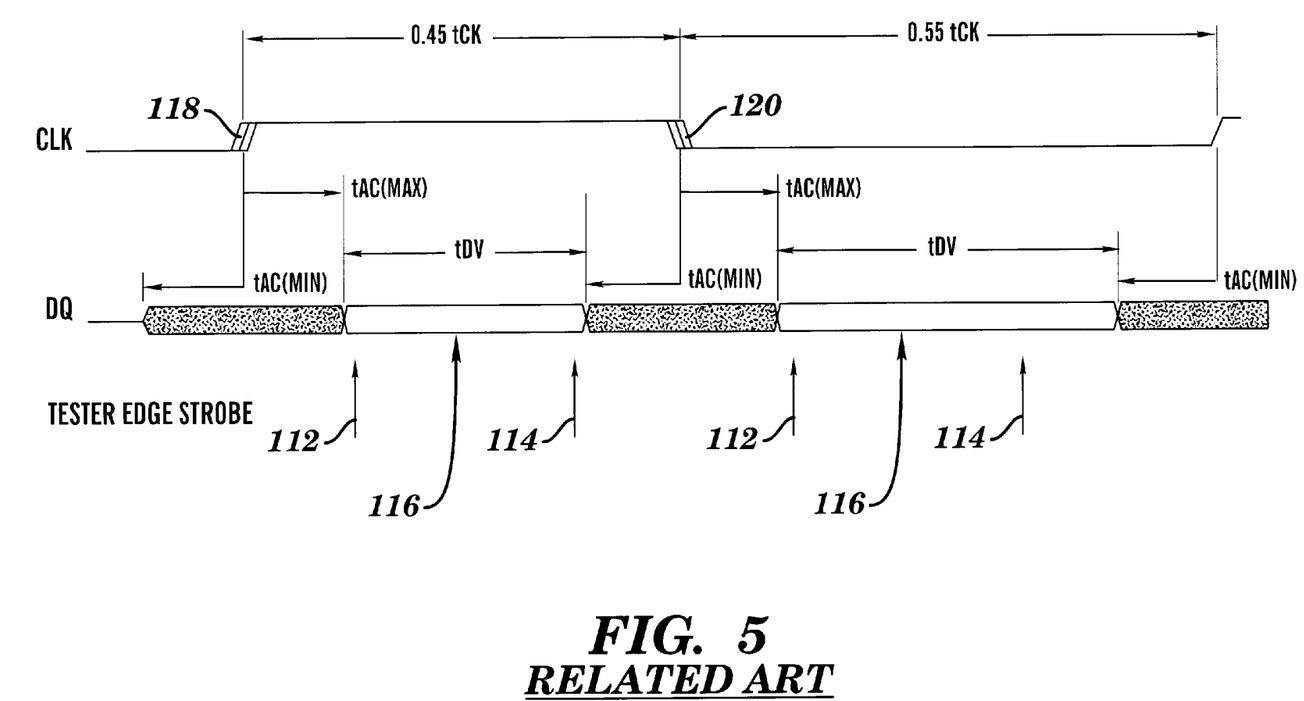
FIG. 5 is a timing diagram illustrating a method for determining a data valid window (tDV) in accordance with the related art.

As illustrated in the timing diagram of FIG. 5, this is accomplished by using the edge strobes 112, 114, provided by available testing systems, such as the Teradyne 996 and Advantest 5581, and searching for the leading edge and trailing edge of DQ with respect to the clock signal (CLK) provided to a DDR-type memory device over many memory read cycles.

The first part of this measurement involves setting the tester's edge strobe 112 within the DQ valid window 116 and then shmooing the edge strobe 112 backward (negative in time) until the first of a group (e.g., eight) of DQ outputs are found to be invalid. As known in the art, depending upon the I/O width of the DDR-type memory device, a group of up to eight DQ's are typically tied to a particular data strobe (DQS). For a DDR-type memory device having 16 DQ's, two DQS's are required, with eight DQ's active with each DQS pulse. This procedure incrementally searches for the latest DQ valid output with respect to the rising edge 118 of the input clock (CLK) of the DDR-type memory device. This is determined to be the beginning of the data valid window. This procedure is performed under worst case operating conditions (voltage, temperature) while reading a worst case output data pattern that insures worst case DQ to clock skew has been generated ($tAC_{max}$). Such a worst case output data pattern may comprise, for example, a pattern wherein seven DO's are transitioning low, while one DQ remains high, followed by one DQ transitioning high, while seven DQ's remain low.

The second part of this measurement involves setting the tester's edge strobe 114 within the DQ valid window 116 and then moving the edge strobe 114 forward (positive in time) until the first of a group of DQ outputs are found to be invalid. This procedure incrementally searches for the earliest invalid DQ output with respect to the falling edge 120 of the input clock (CLK) of the DDR-type memory device. This is determined to be the end of the data valid window. This procedure is again performed under worst case operating conditions (voltage, temperature) while reading a worst case output data pattern to insure that the worst case DQ to clock skew has been generated ($tAC_{min}$).

Once $tAC_{max}$ and $tAC_{min}$ are determined, the width of the data valid window tDV is calculated by subtracting $tAC_{max}$ and $tAC_{min}$ from the minimum clock high ($tCKH_{min}$) or minimum clock low time ($tCKL_{min}$) as set forth in EQUS. 3 and 4. As detailed above, $tCKH_{min}$ refers to the shortest time the CLK signal actually remains, or is expected to remain, high during any cycle, and $tCKL_{min}$ refers to the minimum time the CLK signal actually remains, or is expected to remain, low during any cycle, respectively. The values for $tCKH_{min}$ and $tCKL_{min}$ may be actual measured values, may be determined or estimated from the specification of the system that generates the CLK signal, or may be determined in any other suitable manner.

$$tDV_{min} = tCKH_{min} - tAC_{max} - tAC_{min} \qquad \text{(EQU. 3)}$$

$$tDV_{min} = tCKL_{min} - tAC_{max} - tAC_{min} \qquad \text{(EQU. 4)}$$

The width of the data valid window tDV calculated in accordance with either EQU. 3 or EQU. 4 is much worse (i.e., smaller) than the actual width the data valid window tDV that will ever occur for any given half clock cycle for a particular voltage, temperature, and output data pattern. Although the width of the data valid window tDV will vary over time with respect to the input clock (CLK) signal because of temperature/voltage changes, clock phase changes, dynamic DLL changes, etc., these cumulative factors will never occur simultaneously for any given half clock cycle. This is one reason why measuring the width of the data valid window tDV indirectly (i.e., based on CLK) will result in poor yield or tighter specifications than necessary.

The present invention provides a method for providing the guaranteed widest possible data valid window ($tDVH_{min}$ or $tDVL_{min}$). Unlike the edge strobe method described supra with regard to FIG. 5, the method of the present invention again utilizes the "window strobe" 30 of a testing system 32 to establish ($tDVH_{min}$ or $tDVL_{min}$) Examples of suitable testing systems 32 that provide the required window strobe 30 include the Teradyne 996 and Advantest 5581.

Figure 6:
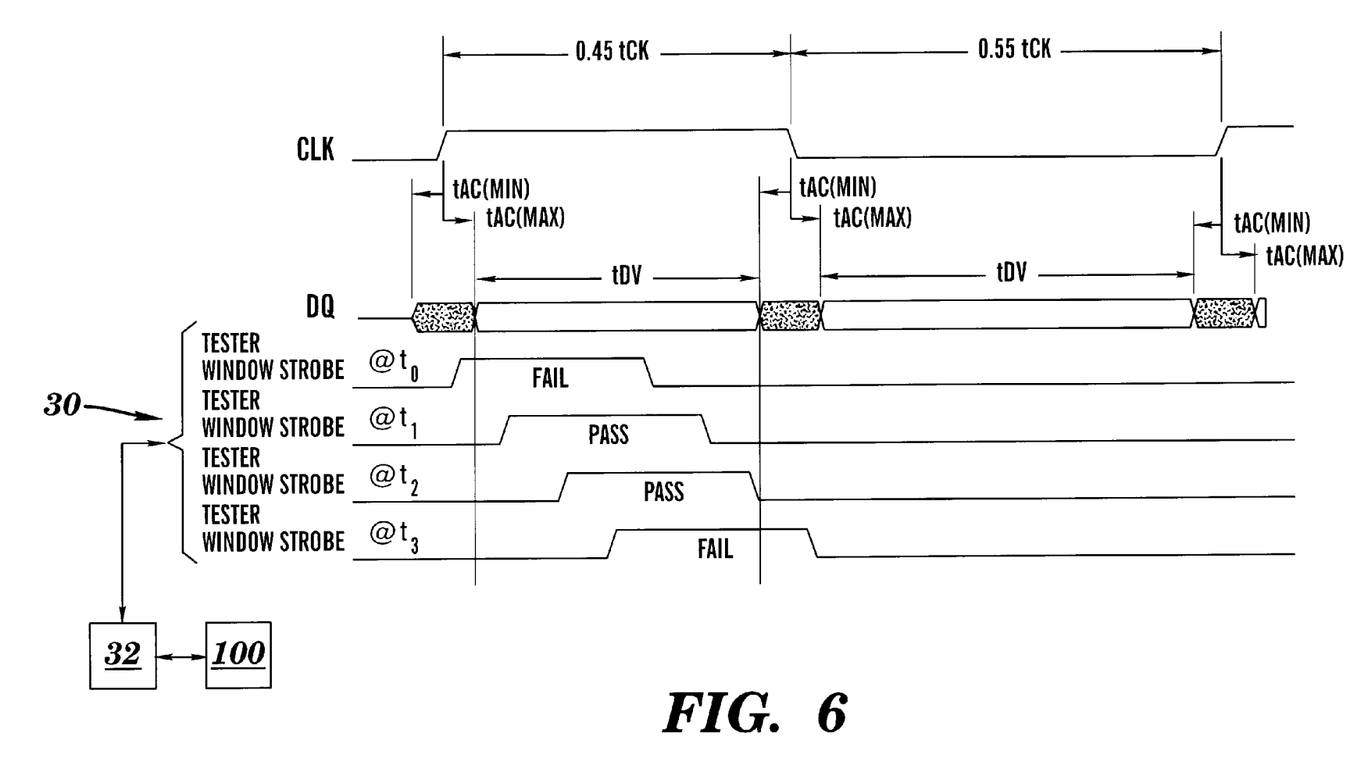
FIG. 6 is a timing diagram illustrating a method for determining a data valid window (tDV) in accordance with the present invention.

A timing diagram illustrating a method for determining $tDVH_{min}$ for a worst case 45/55 CLK duty cycle for a DDR-type memory device 100 in accordance with the present invention is shown in FIG. 6. In particular, the window strobe 30 generated by a testing system 32 is programmed to a desired, initial time width corresponding to the tDV specification of the memory device 100. In practice, however, the actual setting programmed into the testing system 32 would be slightly less than the specification value to compensate for the resolution accuracy of the testing system 32. The output data pattern under test on the DQ's is sampled during the window strobe 30 and if the output data pattern on the DQ's is found to be valid (i.e., the correct high or low state that was initially written into the memory device) at least once during the entire window strobe 30, then the output data pattern under test is deemed as passing. If the output data pattern under test is only valid for a portion of the window strobe 30, then the signal under test is deemed as failing. Again, a comparator, processor, or other device/system capable of comparing the voltage/state of the output data pattern under test on the DQ's to the expected values (e.g., stored in memory) may be used to determine the validity of the output data pattern.

To determine the data valid window, the width of the window strobe 30 is chosen to be equal to the width of the data valid window that is to be guaranteed (i.e., $tDVH_{min}$ or $tDVL_{min}$). In FIG. 6, for example, the window strobe 30 is incremented (shmooed) through the clock (CLK) high period (e.g., 0.45 tCK) while reading an output data pattern on the DQ's from memory that results in the smallest possible data valid window width. Such a worst case output data pattern may again comprise, for example, a pattern wherein all of the DQ's are switching simultaneously from low to high and the data strobe (DQS) is switching from low to high. If the output data pattern on the DQ's is found to be valid during the entire window strobe 30 at least once as the window strobe 30 is shmooed through the clock high period (e.g., "window strobe@$t_1$" or "window strobe@$t_2$" in FIG. 6), then the data valid window $tDVH_{min}$ is guaranteed directly for that portion of the clock cycle. If the output data pattern under test is never found to be valid during the entire window strobe 30, then the current width of the window strobe 30 is too large and must be reduced. The above process is repeated as necessary, using smaller widths of the window strobe 30, until the width of the window strobe 30 results in a passing test, thereby providing a value of $tDVH_{min}$ that can be guaranteed.

Figure 7:
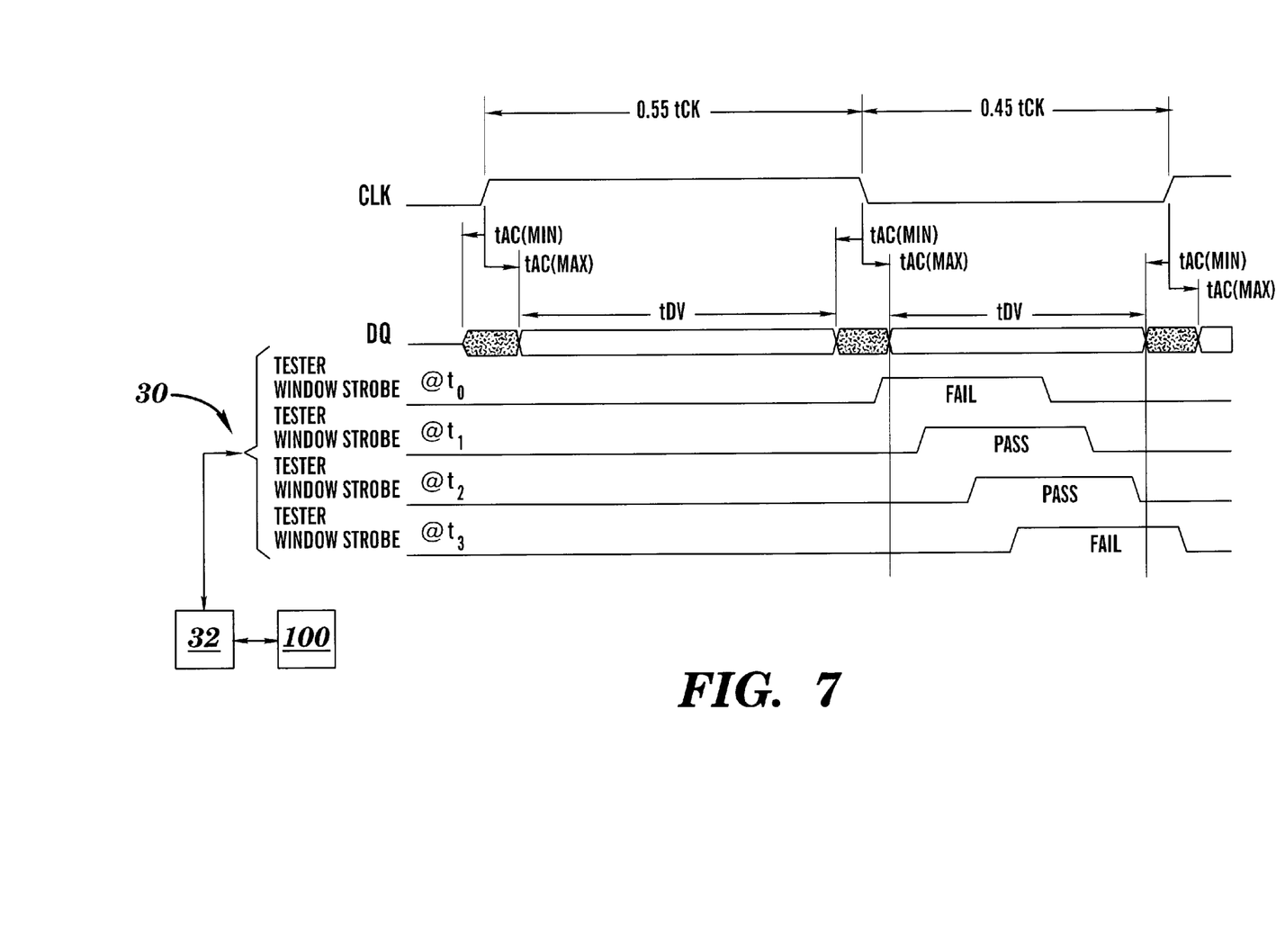
FIG. 7 is a timing diagram illustrating a method for determining a data valid window (tDV) in accordance with the present invention.

A timing diagram illustrating a method for determining $tDVL_{min}$ for a worst case 55/45 CLK duty cycle for a DDR-type memory device 100 in accordance with the present invention is shown in FIG. 7. $tDVL_{min}$ is determined in an analogous manner as $tDVH_{min}$. In particular, the window strobe 30 is incremented (shmooed) through the clock (CLK) low period (e.g., 0.45 tCK) while reading a worst case output data pattern on the DQ's from memory that results in the smallest possible data valid window width. In this case, the worst case output data pattern is just the opposite of that used to determine $tDVH_{min}$. Such a worst case output data pattern may comprise, for example, a pattern wherein all of the DQ's are switching simultaneously from high to low and the data strobe (DQS) is switching from high to low. If the output data pattern on the DQ's is found to be valid during the entire window strobe 30 at least once as the window strobe 30 is shmooed through the clock low period (e.g., "window strobe@$t_1$" or "window strobe@$t_2$" in FIG. 7), then the data valid width (i.e., $tDVL_{min}$) is guaranteed directly for that portion of the clock cycle. If the output data pattern under test is never found to be valid during the entire window strobe 30, then the current width of the window strobe 30 is too large and must be reduced. The above process is repeated as necessary, using smaller widths of the window strobe 30, until the width of the window strobe 30 results in a passing test, thereby providing a value of $tDVL_{min}$ that can be guaranteed.

If the initial, desired value of $tDVH_{min}$ (or $tDVL_{min}$) results in a passing test, the width of the window strobe 30 in each case can be increased incrementally and the test can be repeated until failure. This process will result in the widest possible minimum data valid window.

To insure that the data valid width is truly the worst case, the data pattern output from the DDR-type memory device 100 during the measurement should be chosen to cause the single slowest DQ transition as referenced to the rising edge of the clock (CLK) signal and the fastest single DQ transition as referenced to the falling edge of the clock (CLK) signal, which results in a compression of the tDV window. Once a worst case output data pattern, voltage and temperature are defined, then the minimum data valid width ($tDVH_{min}$ or $tDVL_{min}$) can be guaranteed directly using the above described window strobe 30 method which yields a larger data valid window than can be achieved through indirect measurements.

The present invention allows the width of the data valid window $tDV_{min}$ to be guaranteed on a cycle by cycle basis. In doing so, the incremental detractors (temperature changes, clock phase changes, voltage changes, dynamic DLL changes, etc.) that creep into the data valid window measurement using the edge strobe method over many cycles of operation are eliminated.

Although described above for use with DDR-type memory devices, the present invention can also be used in other types of memory devices in which the minimum width of one or more signal pulses (e.g., DQS, DQ, etc.) needs to be guaranteed on a cycle to cycle basis.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

We claim:

1. A method, comprising the steps or; providing a memory device;

providing testing system having a window strobe; and using the window strobe of the testing system to determine a width of a signal window of the memory device, said using step comprising:

establishing a width of the window strobe;

moving the window strobe in a plurality of time increments through the signal window during a portion of a clock cycle;

reading a data pattern from the memory device at each time increment; and determining if die data pattern read from the memory device is valid at least once during the entire window strobe as the window strobe is moved through the signal window.

2. The method of claim 1, wherein the memory device comprises a double data rate (DDR) memory device.

3. The method of claim 1, wherein the signal window is a data strobe window (DQS) of the memory device.

4. The method of claim 3, wherein the width of DQS is determined for a minimum clock high period.

5. The method of claim 3, wherein the width of DQS is determined for a minimum clock low period.

6. The method of claim 1, wherein the signal window is a data valid window (tDV) of the memory device.

7. The method of claim 6, wherein the width of tDV is determined for a minimum clock high period.

8. The method of claim 6, wherein the width of tDV is determined for a minimum clock low period.

9. The method of claim 1, wherein determining a width of the signal window further comprises:

determining a widest possible minimum guaranteed width of the signal window.

10. The method of claim 1, wherein, if the data pattern is determined to be valid, the width of the signal window is at least the width of the window strobe.

11. The method of claim 1, further comprising, if the data pattern read from memory is determined to be valid;

(a) increasing the width of the signal window;

(b) moving the window strobe in a plurality of time increments through the signal window during a portion of a clock cycle;

(c) reading a data pattern from the memory device at each time increment;

(d) determining if the data pattern read from the memory device is valid at least once during the entire window strobe as the window strobe is moved through the signal window; and if the data pattern read horn the memory device is valid, repeating (a)–(d) until the data pattern read from memory is determined to be invalid.

12. The method of claim 1, further comprising, if the data pattern read from memory is determined to be invalid:

(a) decreasing a width of the signal window;

(b) moving the window strobe in a plurality of time increments through the signal window during a portion of a clock cycle;

(c) reacting a data pattern from the memory device at each time increment;

(d) determining if the data pattern read from the memory device is valid at least once during the entire window strobe as the window strobe is moved through the signal window; and if the data pattern read from the memory device is Invalid, repeating (a)–(d) until the data pattern read from memory is determined to be valid.

13. The method of claim 1, further comprising:

choosing the data pattern such that the reading of the data pattern from the memory device causes the signal window to assume its smallest width.

14. The method of claim 1, wherein a width of the signal window is determined on a cycle by cycle basis.

15. The method of claim 1, wherein the memory device is adapted to X align transitions of data signals to rising and falling edges of a clock signal in a data valid window (tDV), further comprising:

using the window strobe of the testing system to determine a width of tDV.

16. A method for testing a date strobe window (DOS) of a memory device, comprising; providing a testing system having a window strobe; and determining a valid width of DOS using the window strobe, wherein the valid width of DQS is determined by:

establishing a width of the window strobe;

moving the window strobe in a plurality of time increments through DQS during a portion of a clock cycle;

reading a data pattern from the memory device at each time increment;

determining if the read data pattern is valid at least once during the entire window strobe; and establishing a valid width of DQS if the data pattern read from the memory device is determined to be valid.

17. The method of claim 16, wherein the memory device is a double data rate (DDR) memory device.

18. A method for testing a data valid window (tDV) of a memory device, comprising: providing a testing system having a window strobe; and determining a valid width of tDV using the window strobe, wherein the valid width of tDV is determined by:

establishing a width of the window strobe;

moving the window strobe in a plurality of time increments through tDV during a portion of a clock cycle;

reading a data pattern from the memory device at each time increment;

determining if the read data pattern is valid at least once during the entire window strobe; and establishing a valid width of tDV if the data pattern read from the memory device is determined to be valid.

19. The method of claim 18, wherein the memory device is a double data rate (DDR) memory device.

* * * * *

UNITED STATES PATENT AND TRADEMARK OFFICE
CERTIFICATE OF CORRECTION

| | | |
|---|---|---|
| PATENT NO. | : 6,708,298 B2 | Page 1 of 1 |
| APPLICATION NO. | : 09/768122 | |
| DATED | : March 16, 2004 | |
| INVENTOR(S) | : Corbin et al. | |

It is certified that error appears in the above-identified patent and that said Letters Patent is hereby corrected as shown below:

Title Page, Item (75) Inventors

Column 1, Line 2, delete "Corbin, Jr. et al." and insert -- Corbin, et al. --

Column 1, Line 7, delete "William E. Corbin, Jr." and insert -- William R. Corbin --

Signed and Sealed this

Fifth Day of October, 2010

David J. Kappos
*Director of the United States Patent and Trademark Office*